US012666756B2

(12) United States Patent
Huang et al.

(10) Patent No.: US 12,666,756 B2
(45) Date of Patent: Jun. 23, 2026

(54) LASER PROJECTION PROXIMITY MASS TRANSFER DEVICE, METHOD AND EQUIPMENT

(71) Applicant: HUAZHONG UNIVERSITY OF SCIENCE AND TECHNOLOGY, Hubei (CN)

(72) Inventors: Yongan Huang, Hubei (CN); Furong Chen, Hubei (CN); Haiyang Yu, Hubei (CN); Hong Ling, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 755 days.

(21) Appl. No.: 17/947,176

(22) Filed: Sep. 19, 2022

(65) Prior Publication Data

US 2023/0369533 A1 Nov. 16, 2023

(30) Foreign Application Priority Data

May 12, 2022 (CN) .......................... 202210520859.X

(51) Int. Cl.
*H10H 20/01* (2025.01)
*H10W 90/00* (2026.01)

(52) U.S. Cl.
CPC .......... *H10H 20/018* (2025.01); *H10W 90/00* (2026.01)

(58) Field of Classification Search
CPC .......................... H10H 20/018; H01L 25/0753
See application file for complete search history.

(56) References Cited

U.S. PATENT DOCUMENTS 9,773,750 B2 * 9/2017 Bibl ........................ H01L 24/95

FOREIGN PATENT DOCUMENTS

| CN | 103077904 | 5/2013 |
| CN | 105159038 | 12/2015 |
| CN | 111584689 | 8/2020 |
| CN | 212257355 | 12/2020 |
| CN | 113223985 | 8/2021 |
| CN | 114420622 | 4/2022 |

OTHER PUBLICATIONS

Jongseung Yoon et al., "Heterogeneously Integrated Optoelectronic Devices Enabled by Micro-Transfer Printing", Advanced Optical Materials, Sep. 3, 2015, pp. 1313-1335.

* cited by examiner

*Primary Examiner* — Christopher A Culbert
(74) *Attorney, Agent, or Firm* — JCIPRNET

(57) ABSTRACT

The disclosure belongs to the field of MicroLED, and discloses a projection proximity mass transfer device. The device includes a support layer, a dynamic release layer and a adhesive foam layer. The support layer is a base layer; the dynamic release layer is arranged on the support layer. Under laser radiation, the dynamic release layer is ablated to generate ablation gas, thereby causing the dynamic release layer to generate blister; the adhesive foam layer is arranged on the dynamic release layer, and the foam layer is in contact with the MicroLED to be transferred. Under the action of thermal stimulation or laser, the foamed particles inside the adhesive foam layer expand, reducing the adhesion of the foam layer. Thereby, blisters with microstructures are formed at the interface between the stamp and the chip, thus realizing peeling of the MicroLED to be transferred.

3 Claims, 10 Drawing Sheets (a)

(b)

(a)

(b)

0143

0144

0145

0146

0147

0148

0149

0150

0158

0157

0156

0155

0154

0153

0152

0151

LASER PROJECTION PROXIMITY MASS TRANSFER DEVICE, METHOD AND EQUIPMENT

CROSS-REFERENCE TO RELATED APPLICATION

This application claims the priority benefit of China application serial no. 202210520859.X, filed on May 12, 2022. The entirety of the above-mentioned patent application is hereby incorporated by reference herein and made a part of this specification.

BACKGROUND

Technical Field

The disclosure belongs to the field of micro light-emitting diode (MicroLED) assembly, and more particularly, relates to a mass transfer method and equipment for laser projection proximity MicroLED.

Description of Related Art

Display technology has showing a trend of flexibility, ultra-large size, and ultra-high resolution. Compared with conventional display technologies (LCD technology, OLED technology), micro light-emitting diodes (MicroLEDs) display technology has higher resolution, better contrast, longer lifespan, faster response time, and stability. Therefore, MicroLEDs are regarded as the most promising display technology of the next generation. Although, MicroLEDs have many advantages, the difficulties encountered by the commercialization of MicroLEDs mainly lie in full colorization, wavelength consistency and mass transfer, among which mass transfer is very important for large-area display applications. Red, blue and green MicroLEDs need to be selectively integrated on the display substrate, and it is necessary to ensure that the transfer yield is not less than 99.9999%, the chip transfer error does not exceed ±0.5 μm, and the transfer efficiency is greater than 500,000 to 1 million/hour. Therefore, there is a need for efficient and reliable mass transfer techniques and equipment.

At present, in view of the above challenges, the industry has proposed some mass transfer technologies and equipment, includes: (1) The Van der Waals force (VDWE) micro-transfer printing (μTP) technology first proposed by Rogers et al in "Heterogeneously integrated optoelectronic devices enabled by micro-transfer printing"; (2) The electrostatic adsorption transfer technology developed by Apple (U.S. Pat. No. 9,773,750B2); (3) The roll-to-roll (RTR) μTP technique dominated by the KIMM; (4) The laser non-contact transfer dominated by Uniqarta (i.e., Laser-Enabled Advanced Placement (LEAP)) and etc. The transfer stamp mainly relies on the physical contact between the stamp and chips, and realizes pick-up and transfer by regulating the adhesive interface strength of the stamp and chips. Based on the VDWE μTP technology, X-Celeprint has initially developed a corresponding mass transfer equipment. The transfer efficiency is only ~26,000/hour, and the transfer yield is ~99%. However, Selective transfer cannot be achieved. Electrostatic adsorption mainly realizes the transfer of the chip by performing special treatment on the surface of the chip to form an electrostatic adsorption layer on the surface. LuxVue has successfully transferred MicroLED chips sized from 1 μm to 30 μm by using a temporary substrate and electrostatic adsorption stamp. However, electrostatic adsorption needs to be transferred on a specific electrostatic material MicroLED and stamp. RTR transfer may transfer MicroLEDs simultaneously through mechanical deformation. Meanwhile, KIMM has designed a RTR mass transfer device, whose transfer efficiency is only ~200,000 pieces/hour, which cannot meet the actual production requirements. Laser non-contact transfer technology is driven by laser to achieve non-contact selective processing, and realizes the array and batch transfer of MicroLEDs by means of patterned laser spots. The patterned laser forward transfer genre technology method led by Uniqarta Company, which is based on laser-material interface interaction, has the prerogative of small damage to the device, high selectivity, fast response (transfer efficiency~1 million/hour), localization of affected region and so on, thereby realizing the efficient transfer of MicroLED array and batch, and thus being expected to be applied to the mass transfer process of ultra-large and high-resolution MicroLED display manufacturing.

At present, the laser non-contact transfer technology mainly includes laser-induced forward transfer (LIFT) technology and blister-baser laser-induced forward transfer(BB-LIFT) technology. The LIFT technology achieves chip transfer by ablating the shock wave generated by the sacrificial layer in the stamp. However, the shock wave will affect the flight path of the chip, resulting in chip breakage. The BB-LIFT technology may better solve this problem by mainly introducing a DRL layer in the middle and wraps the shock wave, thereby reducing the impact of the shock wave on the transfer of the chip. Meanwhile, the interaction between the laser and the power release layer causes the power release layer to vaporize and form blister to promote chip transfer. However, in this transfer process, various parameters such as the shape of the laser spot, the spot resolution, and the distance between the chip and the receiving substrate affect the transfer accuracy and reduce the controllability of the transfer accuracy. For example, when transferring a chip sized 670 μm×670 μm×50 μm, under the transfer pitch of 195 μm, there is still a deviation, and the mean, median and standard deviation are 61.2 μm, 50.0 μm and 46.3 μm, respectively. To further improve the transfer effect, there are currently some solutions, such as the magnetic-driven chip self-alignment process, which uses a magnetic field to magnetize the laser-induced dropped chip, and pulls the chip to the target position to achieve autonomous positioning. Although this method may further improve the accuracy, it cannot easily realize the close array arrangement of the MicroLED chips on the receiving substrate, and the chip requires a magnetization layer, so there are certain limitations. Chinese Patent application No. CN113223985A proposes a graphene-based shape memory polymer microstructure film and a MicroLED transfer device. A laser emitting unit is used to emit a laser beam to irradiate the graphene-based shape memory polymer in the irradiation area, so that micro-blister is formed in the heating state, thus realizing the transfer of MicroLED. Although this method may be reused and selective release may be achieved, the shape memory polymer using graphene has a slow reaction time and small blister change, which affects the efficiency. In the meantime, the problem of laser spot size, alignment with the seal, etc., still cannot be solved.

In order to achieve the high reliability, high precision and high efficiency requirements of mass transfer, the arraying method of the light spot, the chip alignment and positioning method and the design of the device are three very important issues. At present, there are three major laser spot patterning methods: (1). Optical mask; (2). Diffractive optical element (DOE); (3). Spatial light modulator (SLM). Due to simple structure and low cost, the optical mask is widely used. However, due to the dangers of some lasers, such as excimer lasers, these optical paths are usually sealed, resulting in difficult adjustment of the optical mask. Because the position and shape of the optical mask will ultimately and directly affect the position and shape of patterned laser spot on the processing surface, which will eventually lead to difficult adjustment of the laser spot. In addition, to achieve the assembly accuracy and process reliability, the positioning and alignment of the assembling device and the micro-device are required during the chip pick-up and release process, using visual cameras to assist localization is a method commonly used in the industry. Due to the limitations of lens processing, the larger the field of view of the lens, the lower its optical accuracy. For chips on a wafer, the size of the chips is small, but the quantity is large, and it is difficult to use a single vision component to meet the requirements of large field of view and high precision simultaneously. How to quickly find the target chip on the wafer and simultaneously observe the characteristics of the chip to achieve accurate positioning is also a major problem encountered by the industry. At present, lithography machines (such as Chinese patent application CN105159038A, a method for aligning lithography patterns on the front and back sides of wafers on a single-sided lithography exposure machine) can only basically realize alignment of a lithography mask and an object subjected to lithography. The bonding machine (such Chinese patent application CN103077904A a bonding machine device and bonding alignment method) can only basically achieve alignment of a wafer and an object to be bonded. The above alignment methods can only achieve precise alignment between two objects, and it is difficult to realize the alignment of the light spot, the chip and the driving circuit simultaneously. Some development and progress have been achieved for the structure and system design of mass transfer experimental devices. Chinese patent application No. 114420622A discloses a high-precision transfer equipment and system suitable for micro devices. The transfer head can move horizontally and vertically under the control of a moving device to transfer transfer substrates of different specifications. The transfer efficiency is improved and the production cost is reduced. Chinese patent No. CN111584689A discloses a MicroLED mass transfer device and a transfer method thereof. The multi-array MicroLED irradiation transfer is realized by mask illumination and conveyor belt transfer. During the transfer, the MicroLED located on the sapphire substrate is irradiated by laser and transferred to the adhesive foam layer of the conveyor belt. This method improves the efficiency of the mass transfer device and method by means of arrayed light spots. The above progress is mainly focused on the exploration of new structures of mass transfer devices. During the transfer process, the donor substrate and the receiving substrate need to move together with the laser spot, and the distance and relative parallelism between the two directly affect the yield rate and precision of mass transfer, and the above issues are not taken into consideration in current device designs.

In light of the above-mentioned defects and deficiencies, there is an urgent need in the field to explore a method and device for mass transfer of MicroLED by laser with high reliability, high precision and high efficiency to solve the problems of low yield, high cost, low precision, and slow speed caused by light spot, adhesion, low driving force, substrate spacing, and slow response, other than further meeting the needs of low cost, easy operation, high yield, and high efficiency besides ensuring precision.

SUMMARY

In view of the above defects or needs for improvement of the conventional technology, the present disclosure provides a mass transfer device, method and equipment, which aims to solve the problems of low transfer speed and low yield in the existing mass transfer process of MicroLED.

To achieve the above purpose, in an aspect of the present disclosure, a laser projection proximity mass transfer device is provided, including: a laser module, a laser mask projection optical path module, a vision module and a mass transfer module. The mass transfer module includes a support layer, a dynamic release layer and a adhesive foam layer arranged in a top-down setup.

The support layer is a base layer; the dynamic release layer is arranged on the support layer. Under the action of the laser, the dynamic release layer is ablated to generate ablation gas, thereby causing the dynamic release layer to generate blister. The adhesive foam layer is arranged on the dynamic release layer, and the adhesive foam layer is in contact with the MicroLED to be transferred. Under the action of thermal stimulation or laser, the foamed particles inside the adhesive foam layer expand, reducing the adhesion of the adhesive foam layer, so as to peel the adhesive foam layer from the MicroLED to be transferred.

The laser module is configured to emit the laser, the laser mask projection optical path module is configured to project the laser to the dynamic release layer, and the vision module is configured to observe the transfer process of the MicroLED to be transferred in real time.

Further, the material used for the dynamic release layer is one of polyimide, GaN, triazene polymer, gold and titanium.

Moreover, the adhesive foam layer includes a foamed matrix and foamed particles uniformly distributed in the foamed matrix.

Additionally, the foamed particles are materials with a foaming temperature of 160° C. to 180° C. and a particle size of 1 μm to 15 μm.

Also, the material of the foamed particles is Akzo microsphere foaming agent JH-PG07, JH-PG16 or JH-PG18.

Moreover, the material of the adhesive foamed matrix is a thermoplastic material with viscoelasticity.

Further, the thickness of the support layer is 500 μm to 1000 μm.

In order to achieve the above purpose, in another aspect of the present disclosure, a method for preparing a mass transfer module in the laser projection proximity mass transfer device is provided, including the following steps:

S1, selecting a hard and transparent substrate as the support layer;

S2, spin-coating the solution of the dynamic release layer on the support layer, and performing curing;

S3, selecting the materials of the adhesive foamed layer matrix and the foamed particles, mixing the two evenly to form a mixed solution, spin-coating the mixed solution on the cured dynamic release layer, and performing curing, so as to obtain the required mass transfer device.

Moreover, in step S2, the curing temperature is 180° C. to 220° C., and the curing time is 3 hours to 5 hours.

Furthermore, in step S3, the curing temperature is 60° C. to 90° C., and the curing time is 10 minutes to 20 minutes.

In order to achieve the above purpose, in another aspect of the present disclosure, there is provided a method for performing single laser mass transfer using the laser projection proximity mass transfer device, including the following steps:

S1, setting the mass transfer device above the MicroLED to be transferred, and corresponding them one by one;

S2, placing the transfer device with the MicroLED array on a hot plate and heating it to 120-180° C., the foamed ball in the adhesive foam layer is heated to expand, and the interface between the stamp and the MicroLED chip forms a microstructure, and the initial formation changes the interface adhesion;

S3, moving a transfer stamp with the prepared MicroLED array to a laser-driven platform; using a single laser to irradiate the mass transfer device, wherein the laser passes through the support layer and is irradiated on the dynamic release layer, so that the dynamic release layer is ablated or generates a phase change blister, and a contact area of an interface between the adhesive foam layer of the mass transfer device and the MicroLED to be transferred is further reduced;

S4, a blister of the mass transfer device produced a rebound, allowing the MicroLED to be completely peeled from the stamp and successfully transferred to a receiving substrate.

In order to achieve the above purpose, in another aspect of the present disclosure, a laser projection proximity mass transfer device is provided, including the laser projection proximity mass transfer device and a motion platform as described in any aspects.

The laser module includes an ultraviolet laser (UV laser) and an infrared laser.

The laser mask projection optical path module includes an optical path system, a total reflection mirror, a telephoto system, an observation camera, an attenuator, a transflective sheet, a light homogenizer, a field lens, a converging lens system and a focal plane.

The attenuator is arranged in front of the UV laser, and is configured to adjust the output energy of the laser emitted by the UV laser. The telephoto system is arranged behind the attenuator for expanding and shaping the light spot from the attenuator. The light homogenizer is arranged behind the telephoto system, and is configured to intercept a wavelength-stabilized light beam from the light from the telephoto system. The transflective sheet is between the attenuator and the telephoto system, and is configured to change the direction of the light source of the UV laser and the infrared laser. The observation camera is in the transflective sheet, and configured to observe the alignment of the chip and the light spot. The field lens and the converging lens system are set behind the transflective sheet, and configured for patterning and focusing the light from the light homogenizer, the motion platform is arranged below the field lens and the converging lens system.

Moreover, a reflector is arranged between the light homogenizer and the telephoto system for changing the directions of the optical paths of the UV laser and the infrared laser light source.

Additionally, the system also includes a field lens and a converging lens system for converging and patterning the light source of the UV laser and the infrared laser.

In order to achieve the above purpose, in another aspect of the present disclosure, there is provided a method for performing dual-laser mass transfer using the laser projection proximity mass transfer device, including the following steps:

S1, setting the mass transfer module above the MicroLED to be transferred, and corresponding them one by one;

S2, with the dual-laser combination in which UV laser acts first and infrared laser acts next, adjusting the infrared laser for triggering first, and the infrared laser is irradiated to the adhesive foam layer in the mass transfer device, so that the foamed material is thermally expanded, so that the MicroLED and the stamp initially form a microstructure;

Or, in the case of dual-laser combination in which infrared laser acts first and UV laser acts next, adjusting the UV laser for triggering first, and the UV laser is irradiated to the dynamic release layer in the mass transfer device, so that the interior of the dynamic release layer is ablated, and blister and gas are formed initially;

S3, subsequently, under the dual-laser combination in which UV laser acts first and infrared laser acts next, adjusting the UV laser again for triggering, so that the dynamic release layer is thermally expanded, or a phase change occurs, or a sound wave is generated to flow, etc., so that the film bulges to form blister, so that the interface adhesion between the mass transfer device and the MicroLED is drastically weakened;

Or, in the case of dual-laser combination in which infrared laser acts first and UV laser acts next, at this time, adjusting the infrared laser for triggering first, and the infrared laser is irradiated to the ablation gas of the dynamic release layer in the mass transfer device, so that the gas is heated and expanded, and the expanding material in the adhesive foam layer is heated to makes the blister larger, resulting in a sharp weakening of the interface adhesion between the mass transfer device and the MicroLED;

S4, applying a peeling force slowly, and the MicroLED is ejected until it is completely separated from the transfer device.

In general, compared with the conventional technology, the above technical solutions conceived by the present disclosure have the following advantageous effects:

1. Laser Lift-off: Currently, MicroLEDs are mostly grown on GaN substrates on sapphire substrates. Before mass transfer of MicroLED chips, GaN-based LED chips need to be peeled from the substrate and transferred to a temporary substrate. The local decomposition of GaN relies on the absorption of intensive photon energy, and the magnitude of energy should be higher than the bandgap voltage of GaN (3.42 eV). The laser projection proximity mass transfer equipment of the present disclosure may realize the patterned laser peel-off GaN process. The transfer of MicroLEDs from native substrates to temporary substrates is accomplished by scanning or bulk illumination.

2. Mass transfer: The laser projection proximity mass transfer equipment in the present disclosure is mainly adopted for the mass transfer process. Many of the transfer methods mentioned above in this disclosure may be implemented on the device. According to the disclosure, a light spot with uniform energy distribution is formed on the plane where the stamp is located, and the light spot is irradiated on the stamp. According to different materials and transfer methods, the interaction between the laser and the stamp produces blister. The blister provides the driving force for the transfer of the chip, and the chip is lifted up, which causes separation of the chip and stamp interface. In the method for mass transfer of laser projection proximity MicroLED of the present disclosure, the method is characterized in that the distance between the chip and the receiving substrate must meet certain requirements. The lifted chip has a weak contact with the receiving substrate, which limits the dislocation motion of the chip and ensures the transfer precision. It should be noted that, as a specific implementation example of the present disclosure, the mass transfer function related to the device is not limited to the above-mentioned process method, and is also applicable to laser non-contact transfer and contact-type transfer.

3. Removal of dead pixels: A laser projection proximity mass transfer equipment in the present disclosure provides a laser projection light spot and a multi-motion platform alignment device. Replacing different masks may get different patterns of light spots. As an example of the present disclosure, the device may be used in a MicroLED dead pixel removal process. After replacing the mask with a single-hole mask, an approximate point light spot may be obtained. After the MicroLED is transferred to the temporary substrate, it is inevitable that some dead pixels will occur, and the MicroLED chips on the wafer also have a certain dead pixel rate. To ensure the yield of the mass transfer of MicroLED chips, it is necessary to remove the defective chips on the temporary substrate first. The device of the present disclosure has the capability of high-precision optical positioning and alignment, and may form a single small light spot to irradiate a single chip to realize the removal of dead pixels.

4. The method of "proximity" laser mass transfer MicroLED provided by the present disclosure not only may rapidly control the blister form with microstructure of the stamp, as well as the blister height with microstructure and the chip-stamp interface adhesion by laser, but also needs to match the micro-spacing between the MicroLED and the receiving substrate, so that the original state of the chip and the receiving substrate changes from non-contact to weak contact, so as to achieve high-precision and high-reliability transfer, and avoid effect caused by laser shock waves, chip flying, asymmetric peeling, chip bouncing back on the receiving substrate, and chip deflection and other factors on the transfer precision. As such, MicroLED transfer precision and efficiency may be significantly improved.

5. The present disclosure adopts a laser projection system, which may project the laser beam into a plurality of single beam lasers through the mask, so as to realize parallel transfer. Meanwhile, the projection method is adopted to make the mask hole for processing larger than the required light spot size by a certain multiple compared to the same ratio, thereby greatly reducing the processing difficulty of the mask, improving the light spot resolution, further reducing the laser diffraction effect, while homogenizing the shape of light spot and reducing the influence of uneven light spot energy and shape on the transfer precision, thereby considerably improving the mass transfer precision.

6. The present disclosure provides a "laser combination method" design, which realizes a "redundant process" under the combination of a single laser or a dual laser, that is, "blister with microstructures". During the transfer process, machine vision may be used to detect that the MicroLED chip is still not transferred, and the adhesion between the untransferred chip and the transfer stamp may be adjusted again, so as to transfer the untransferred chip and further ensure yield rate of chip transfer.

7. The present disclosure provides a device that can be used with both single laser and double laser, thereby making breakthrough for the limitations of transferring chip materials and laser absorbing materials. In other words, the process of using "UV laser first and infrared laser later" may be used to transfer light sensitive materials that are not resistant to high temperature, and the process of using "infrared laser first and UV laser later" may also be used to transfer MicroLED chips with high temperature-resistance. In the meantime, a single laser process may also be used to transfer large-sized chips.

DESCRIPTION OF THE EMBODIMENTS

In order to make the purpose, technical solutions and advantages of the present disclosure clearer, the present disclosure will be further described in detail below with reference to the accompanying drawings and embodiments. It should be understood that the specific embodiments described herein are only used to explain the present disclosure, but not to limit the present disclosure. In addition, the technical features involved in the various embodiments of the present disclosure described below can be combined with each other as long as they do not conflict with each other.

Figure 1:
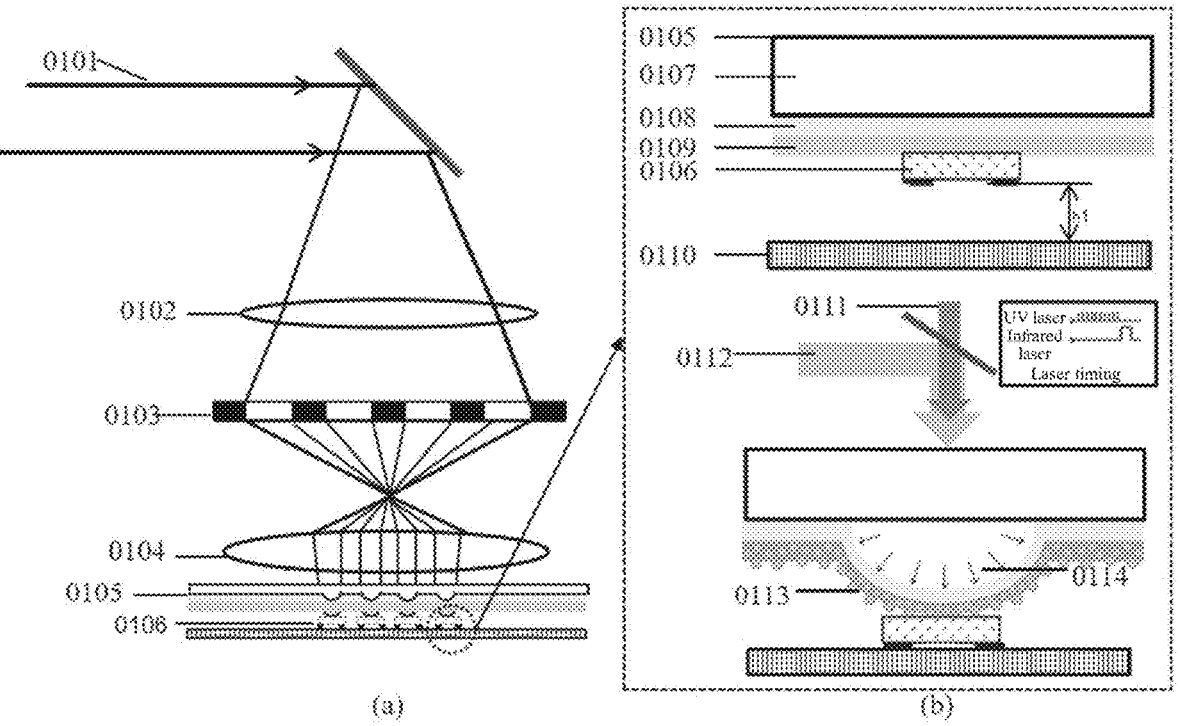
FIG. 1 is a schematic diagram of the laser projection proximity MicroLED mass transfer method (LaserPPT) involved in the present disclosure.

As shown in FIG. 1, FIG. 1 is a schematic diagram showing the principle of the laser projection proximity MicroLED mass transfer method (LaserPPT) involved in the present disclosure. As shown in (a) of FIG. 1, after the laser beam 0101 is homogenized by the homogenizer 0102, a patterned laser array light spot is formed by projection through the controllable optical mask 0103. After passing through the light spot scaling and focusing system 0104 and being reduced by a certain multiple, an array of light spots is formed to act on the designed transfer stamp 0105 precisely. For example, (b) of FIG. 1 illustrates mass transfer in "proximity mode". Before the MicroLED array 0106 is transferred, there is a micrometer-level interval between the MicroLED array 0106 adhered to the transfer stamp 0105 and the receiving substrate (see (b) of FIG. 1, as shown by h1). Under the action of the laser, the stamp is regulated to produce "blister 0114 with microstructure", and with a "redundant" height that is generated by the microstructure and the blister and close to the distance between the MicroLED array 0106 and the receiving substrate, the MicroLED array is brought into contact with the receiving substrate. Under the circumstances, the adhesion between the stamp and the MicroLED is greatly reduced, and the transfer stamp is slowly lifted, thereby realizing the patterned transfer of the MicroLED array.

The LaserPPT of the present disclosure is a patterned laser array light spot formed by the projection of a controllable optical mask by designing different stamp structures and selecting different laser combinations according to the operation principle of different lasers and stamps. Meanwhile, the "proximity" transfer method is adopted, that is, before the transfer, the MicroLED adhered to the stamp is separated from the receiving substrate by a distance of a micron level, which precisely acts on the designed transfer stamp structure, regulates the stamp and produces a "blister with microstructure". A "redundant" height is generated through the microstructure and blister. The "redundant" blister height with microstructures is close to the spacing (micrometer level) between the MicroLED and the substrate, allowing for high-precision advantage of stamp contact type transfer and high efficiency of laser forward transfer. As such, it is possible to avoid the influence caused by laser shock wave, uneven light spot, chip flying, asymmetric peeling bouncing back on the receiving substrate and other factors on the transfer precision. In this way, the precision and efficiency of transfer of MicroLED may be considerably improved. The LaserPPT method mainly includes three design methods: "laser combination method", "projection method" and "proximity method", which are characterized by:

The "laser combination mode" design mainly includes infrared and UV laser and multi-beam laser combination mode. The multi-beam laser may be controlled by the multi-channel signal pulse delay generator.

1) A laser beam is excited to act on a corresponding stamp, and make the stamp produce "blister with microstructures".

2) According to the operation conditions, the sequence of triggering the two laser beams is adjusted flexibly, namely "UV laser first and infrared laser next", "infrared laser first and UV laser next", "single UV laser" or "single infrared laser" and other process modes, thereby jointly acting on the adhesion foam layer and the dynamic release layer inside the stamp. In this way, different effects of "blister redundancy with microstructure" are generated, which further changes the adhesion between the MicroLED and the stamp and the distance from the MicroLED to the receiving substrate.

3) The combination of multi-beam lasers may be arranged coaxially (that is, controlling the sequence of lasers by triggering time), or may be laid out off-axis (that is, controlling the sequence of lasers by moving direction), so as to adapt to different MicroLED transfer scenarios.

The "projection mode" design mainly uses a laser projection optical path system, that is, an optical system is used to homogenize the Gaussian distributed laser light into a flat-top beam. Moreover, in order to achieve array formation, the pattern on the mask is reduced by a certain multiple through optical projection, focused and aligned with the chip to be transferred on the stamp, and radiated on the dynamic release layer of the stamp. This optical projection method may effectively improve the resolution of laser radiation, reduce diffraction effects, unevenness of Gaussian spot, etc., and the processing difficulty of the mask is considerably reduced, while the irradiation energy density of the laser to the mask is reduced, and the service life of the mask is improved.

In the "proximity method" design, mainly before the transfer, the stamp adhered with the MicroLEDs needs to be separated from the receiving substrate by a distance of a micron level, and under the action of the laser, the dynamic release layer and the adhesive foam layer in the stamp are induced to generate "blister with microstructure", so that the original state of the chip and the receiving substrate is changed from "no contact" to "micro contact". The specifically required spacing is in the ablation gas of the dynamic release layer, such that the "redundant height" of blister with microstructures gradually tends to be between the height of the equilibrium phase and the highest blister height of the equilibrium phase. In this way, it is possible to avoid dramatic blister change of the ablation gas in the early stage under the action of the laser, resulting in velocity shocks and viscoelastic effects with the receiving substrate. In the meantime, the design may also include single/multi-laser projection proximity process, the core of which is that the form of stamp is different. For example, multi-laser projection proximity process mainly uses a stamp with a adhesion foamed layer with micro-foaming balls, which can expand under the action of a laser, thereby changing the adhesion and having a height of "blister with a microstructure".

A laser projection proximity mass transfer device in the present disclosure may achieve the following functions:

1. Laser peel-off: Currently, MicroLEDs are mostly grown on GaN substrates on sapphire substrates. Before mass transfer of MicroLED chips, GaN-based LED chips need to be peeled from the substrate and transferred to a temporary substrate. The local decomposition of GaN relies on the absorption of intensive photon energy, and the magnitude of energy should be higher than the bandgap voltage of GaN (3.42 eV). The laser projection proximity mass transfer equipment of the present disclosure may realize the patterned laser peel-off GaN process. The transfer of MicroLEDs from native substrates to temporary substrates is accomplished by scanning or bulk illumination.

2. Mass transfer: The laser projection proximity mass transfer equipment in the present disclosure is mainly adopted for the mass transfer process. Many of the transfer methods mentioned above in this disclosure may be implemented on the device. According to the disclosure, a light spot with uniform energy distribution is formed on the plane where the stamp is located, and the light spot is irradiated on the stamp. According to different materials and transfer methods, the interaction between the laser and the stamp produces blister. The blister provides the driving force for the transfer of the chip, and the chip is lifted up, which causes separation of the chip and stamp interface. In the method for mass transfer of laser projection proximity MicroLED of the present disclosure, the method is characterized in that the distance between the chip and the receiving substrate must meet certain requirements. The lifted chip has a weak contact with the receiving substrate, which limits the dislocation motion of the chip and ensures the transfer precision. It should be noted that, as a specific implementation example of the present disclosure, the mass transfer function related to the device is not limited to the above-mentioned process method, and is also applicable to laser non-contact transfer and contact-type transfer.

3. Removal of dead pixels: A laser projection proximity mass transfer equipment in the present disclosure provides a laser projection light spot and a multi-motion platform alignment device. Replacing different masks may get different patterns of light spots. As an example of the present disclosure, the device may be used in a MicroLED dead pixel removal process. After replacing the mask with a single-hole mask, an approximate point light spot may be obtained. After the MicroLED is transferred to the temporary substrate, it is inevitable that some dead pixels will occur, and the MicroLED chips on the wafer also have a certain dead pixel rate. In order to ensure the yield of the mass transfer of MicroLED chips, it is necessary to remove the defective chips on the temporary substrate first. The device of the present disclosure has the capability of high-precision optical positioning and alignment, and may form a single small light spot to irradiate a single chip to realize the removal of dead pixels.

Figure 2:
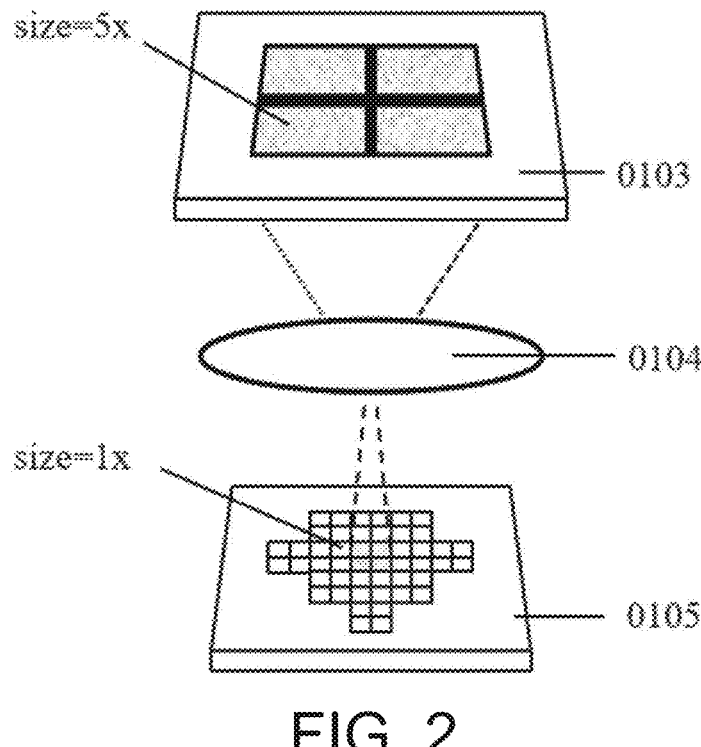
FIG. 2 is an explanatory diagram illustrating the size of the arrayed light spot of the laser "projection type" design of the present disclosure after being reduced by a certain multiple.

FIG. 2 is a schematic diagram illustrating the size of the laser arrayed spot reduced by a certain multiple according to the present disclosure. The homogenized laser beam 0101 passes through the mask 0103 to form an array or patterned light spot. The pattern size is 5×, which is reduced to 1× by the light spot scaling and focusing system 0104 on the support layer 0107 of the stamp 0105 (this example is preferably implemented with a transparent glass).

Figure 3:
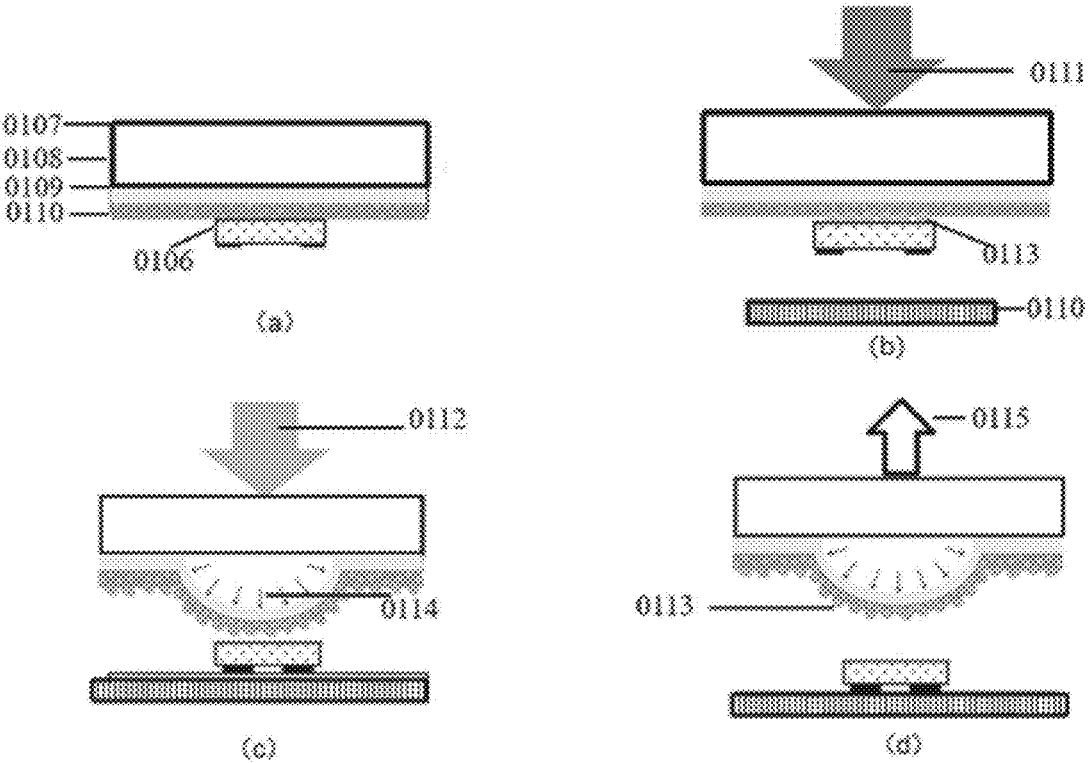
FIG. 3 is a schematic diagram of the "laser combination" design method involved in the present disclosure under the process mode of "infrared laser first and UV laser next".

Embodiment 1: a Projection Proximity Mass Transfer Device and Method for a Dual-Laser Combination As shown in FIG. 3, FIG. 3 is a schematic diagram showing the principle of a dual-laser combination projection proximity mass transfer method involved in the present disclosure in the process mode of "infrared laser first, and UV laser next" in which the infrared laser acts first and the UV laser acts next. (a) in FIG. 3 is a schematic diagram of MicroLED array 0106 being captured by a dual laser-transfer stamp device to achieve overall MicroLED pickup. The stamp 0105 is composed of a three-layer structure: a support layer 0107, a dynamic release layer 0108, and a adhesive foam layer 0119. The captured MicroLED array 0106 is tightly bonded to the adhesive foam layer 0119. (b) of FIG. 3 shows that the infrared laser 0111 acts on the adhesive foam layer 0119 from the back side of the support layer 0107 to obtain the adhesive foam layer after the expansion of the foamed particles, thereby forming a micro-structure 0113. Under the circumstances, the contact area between the MicroLED array 0106 and the adhesive foam layer after expansion of the foamed particles is significantly reduced, and the bonding position between the two is in a critical state. (c) of FIG. 3 shows that the UV laser 0112 acts on the dynamic release layer 0108 from the back side of the support layer 0107. After the dynamic release layer is ablated by the UV laser 0108, ablation gas is generated and blister 0114 is formed. blister 0114 will change the curvature of the adhesive foam layer while changing the distance to the receiving substrate 0110, so that the original no-contact mode is changed to a micro-contact mode. (d) of FIG. 3 show that, under the action of the peeling force 0115, the dual laser-transfer stamp 0105 is lifted, and the transfer of the MicroLED array 0106 is completed. This process mode is suitable for the transfer of MicroLEDs with high temperature resistance (1 to 200° C.).

Figure 4:
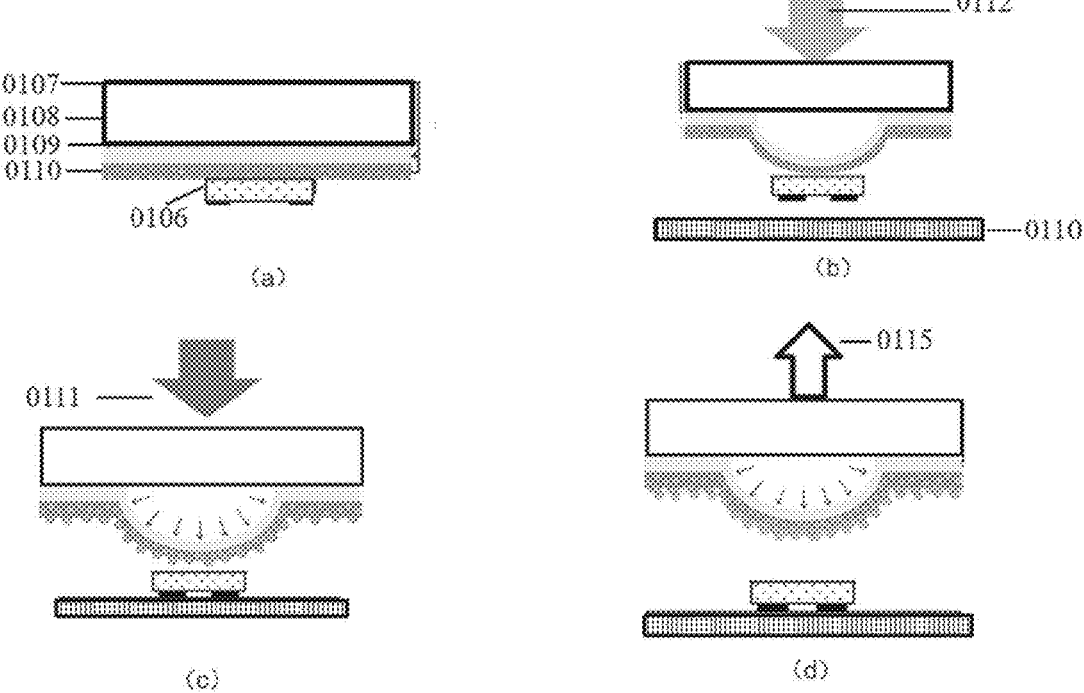
FIG. 4 is a schematic diagram of the "laser combination" design method involved in the present disclosure under the process mode of "UV laser first and infrared laser next".

As shown in FIG. 4, FIG. 4 is a schematic diagram showing the principle of a dual-laser combination projection proximity mass transfer method involved in the present disclosure in the process mode of "UV laser first, and infrared laser next". (a) in FIG. 4 is a schematic diagram of MicroLED being captured by a dual laser-transfer stamp device to achieve overall MicroLED pickup. (b) of FIG. 4 shows that the UV laser 0112 acts on the dynamic release layer 0108 from the back side of the support layer 0107. After the dynamic release layer is ablated by the UV laser 0112, ablation gas is generated and blister 0114 is formed. Under the circumstances, the contact area between the MicroLED array 0106 and the adhesive foam layer 0109 is reduced, and the bonding position between the two is in a critical state. (c) of FIG. 4 shows that the infrared laser 0111 acts on the adhesive foam layer 0109 from the back side of the support layer 0107. After the expansion of the foamed particles, the contact area between the MicroLED array 0106 and the adhesive foam layer 0109 is significantly reduced, and the gas originally ablated by the UV laser 0112 is continuously heated, and the dynamic release layer 0108 generates larger blister 0114. The adhesion between the MicroLED array 0106 and the adhesive foam layer 0109 is greatly reduced, so that the MicroLED array 0106 is dropped and received by the receiving substrate 0110. (d) of FIG. 4 show that, under the action of the peeling force 0115, the dual laser-transfer stamp 0105 is lifted, and the transfer of the MicroLED array 0106 is completed. This process mode is suitable for the transfer of MicroLEDs with low temperature resistance.

Figure 5:
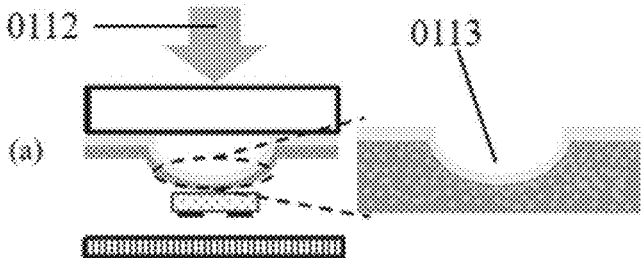
FIG. 5 is a schematic diagram showing the principle of a redundant process of the "laser combination" design method involved in the present disclosure.
Figure 5:
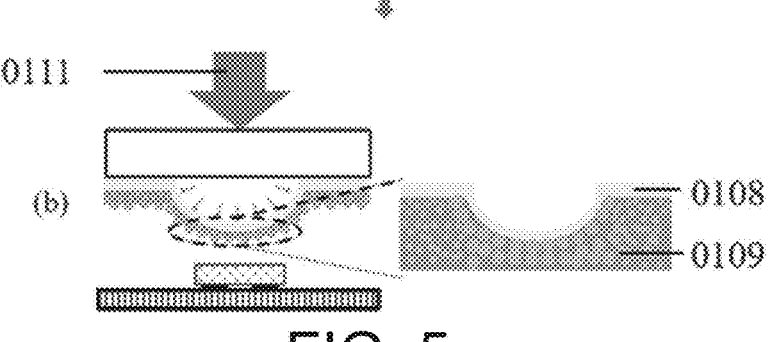

As shown in FIG. 5, FIG. 5 is a schematic diagram showing the principle of a redundant process of a dual laser combination projection proximity mass transfer method involved in the present disclosure. The redundant process is used for MicroLEDs that have not been transferred before the secondary transfer; (a) of FIG. 5 shows the scenario that, after the effect of dual laser, the existence of individual untransferred chips is observed by machine vision and other methods; as shown in (b) of FIG. 5, under the circumstances, the infrared laser is turned on, and the infrared laser 0111 performs action again, so that the gas that is originally generated due to ablation by UV laser 0112 is continued to be heated. Then, the dynamic release layer 0108 generates larger blister. Meanwhile, the heated gas may further heat the foamed balls of the adhesive foam layer 0109 to continue to expand, changing the adhesion of the adhesive foam layer, thereby transferring the untransferred chips. In this manner, the MicroLED array 0106 is all successfully transferred to the receiving substrate.

Figure 6:
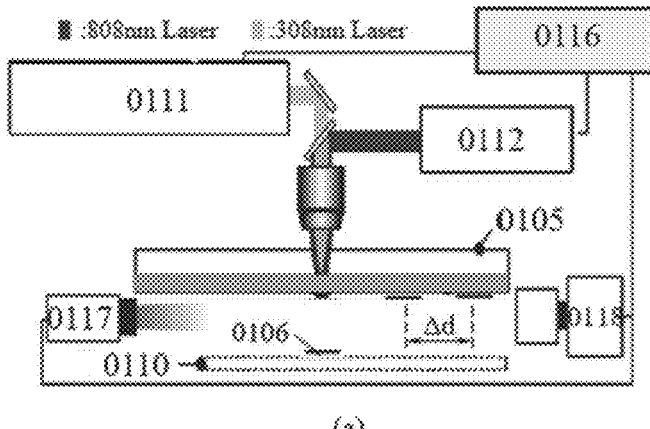
FIG. 6 is a principle and laser timing diagram of the projection proximity mass transfer device under the process mode of "infrared laser first and UV laser next" involved in the present disclosure.
Figure 6:
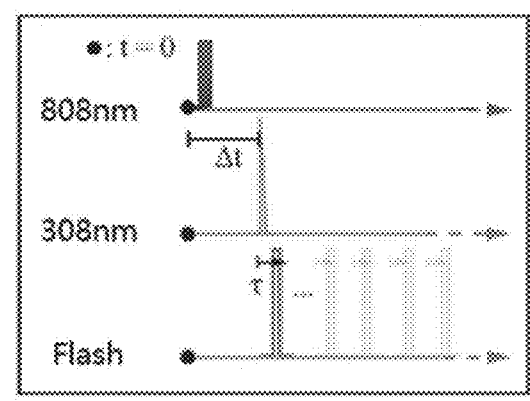

As shown in FIG. 6, FIG. 6 is a schematic principle diagram and a laser timing diagram of a dual-laser combination projection proximity mass transfer device constructed according to a preferred embodiment of the present disclosure in a laser coaxial layout mode. (a) of FIG. 6 is a schematic principle diagram of a dual-laser combination projection proximity mass transfer device in the laser coaxial layout mode. The mass transfer device consists of a dynamic release layer 0105, a dual laser system, a camera observation module and a receiving substrate 0110. The dual laser system consists of the infrared laser 0111, the UV laser 0112 and the high-speed camera 0118. The infrared laser 0111 and the UV laser 0112 are strictly coaxial. According to the laser timing diagram, the system controls the activation and deactivation of the infrared and UV lasers; the camera observation module consists of a camera light source 0117 and the high-speed camera 0118, and is configured to observe the transfer of MicroLED array 0106 after the action performed by the laser. (b) of FIG. 6 is the laser timing diagram in this layout mode. The high-speed camera 0118 controls the activation and deactivation of the infrared laser 0111, the UV laser 0112, and the camera light source 0117. During transfer, the infrared laser 0111 is turned on first, and after performing action for a period of time, the UV laser 0112 is turned on to perform action. When the dual laser completes action, the camera light source is controlled to collect images and check the transfer of the MicroLED. If there is an untransferred MicroLED, the infrared laser 0111 is turned on again to completely and successfully transfer the MicroLED. After one transfer is completed, a gap distance for one MicroLED is set for the next transfer. This layout mode is suitable for high-precision, small-scale transfer scenarios.

Figure 7:
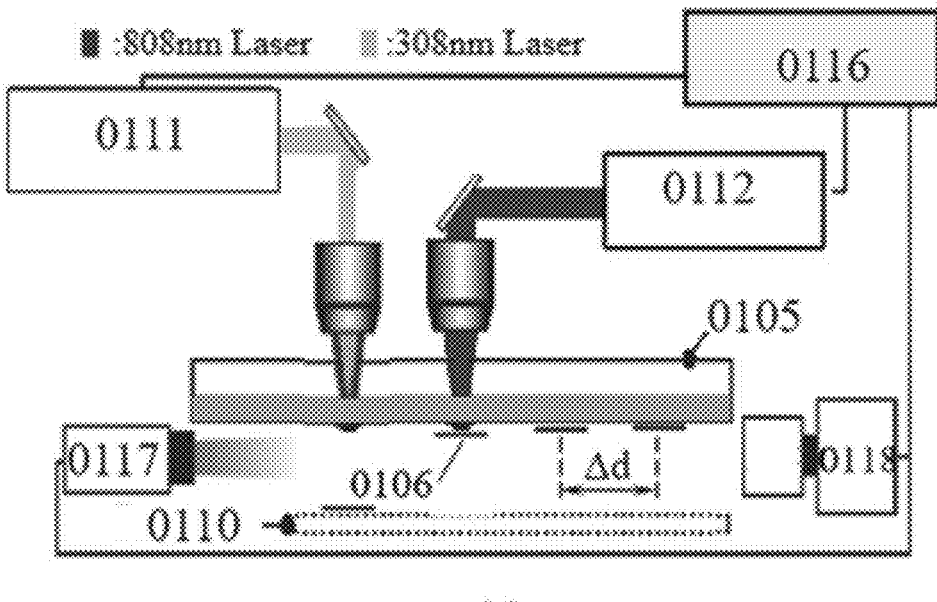
FIG. 7 is a principle and laser timing diagram of the projection proximity mass transfer device under the process mode of "UV laser first and infrared laser next" involved in the present disclosure.
Figure 7:
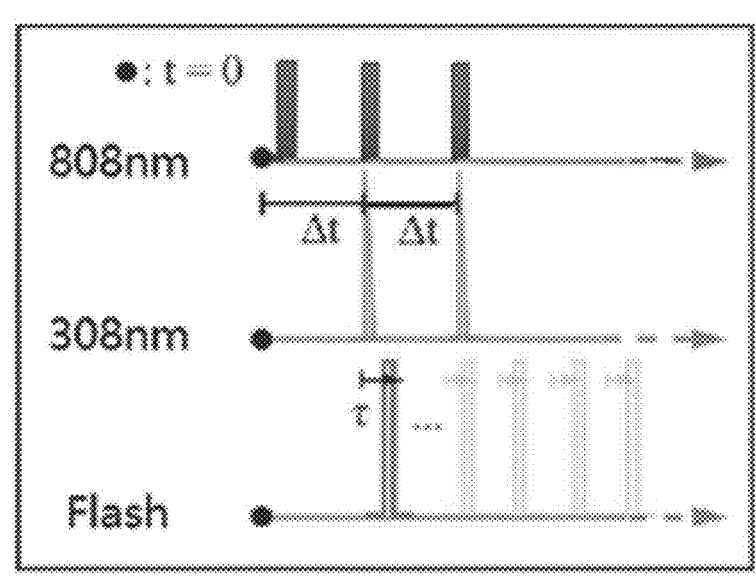

As shown in FIG. 7, FIG. 7 is a schematic principle diagram and a laser timing diagram of a dual-laser combination projection proximity mass transfer device constructed according to a preferred embodiment of the present disclosure in a laser off-axis layout mode. (a) of FIG. 7 is a schematic principle diagram of a dual-laser combination projection proximity mass transfer device in the laser off-axis layout mode. The mass transfer device consists of a dynamic release layer, a dual laser system, a camera observation module and a receiving substrate 0110. The dual laser system consists of the infrared laser 0111, the UV laser 0112 and the high-speed camera 0118. The infrared laser 0111 and the UV laser 0112 are separated by several times the gap distance Δd of MicroLED. According to the laser timing diagram, the system controls the activation and deactivation of the infrared and UV lasers; the camera observation module consists of a camera light source 0117 and the high-speed camera 0118, and is configured to observe the transfer of MicroLED array 0106 after the action performed by the laser. (b) of FIG. 7 is the laser timing diagram in this layout mode. The high-speed camera 0118 controls the activation and deactivation of the infrared laser 0111, the UV laser 0112, and the camera light source 0117. In the initial transfer, the infrared laser 0111 is turned on first and the UV laser 0112 is turned off. After the infrared laser 0111 performs action, the gap distance Δd for one MicroLED is set. Under the circumstances, the infrared laser 0111 and the UV laser 0112 are turned on simultaneously. When the dual laser completes action, the camera light source is controlled to collect images and check the transfer of the MicroLED. This layout mode is suitable for large-scale and high-efficiency transfer scenarios.

Figure 8:
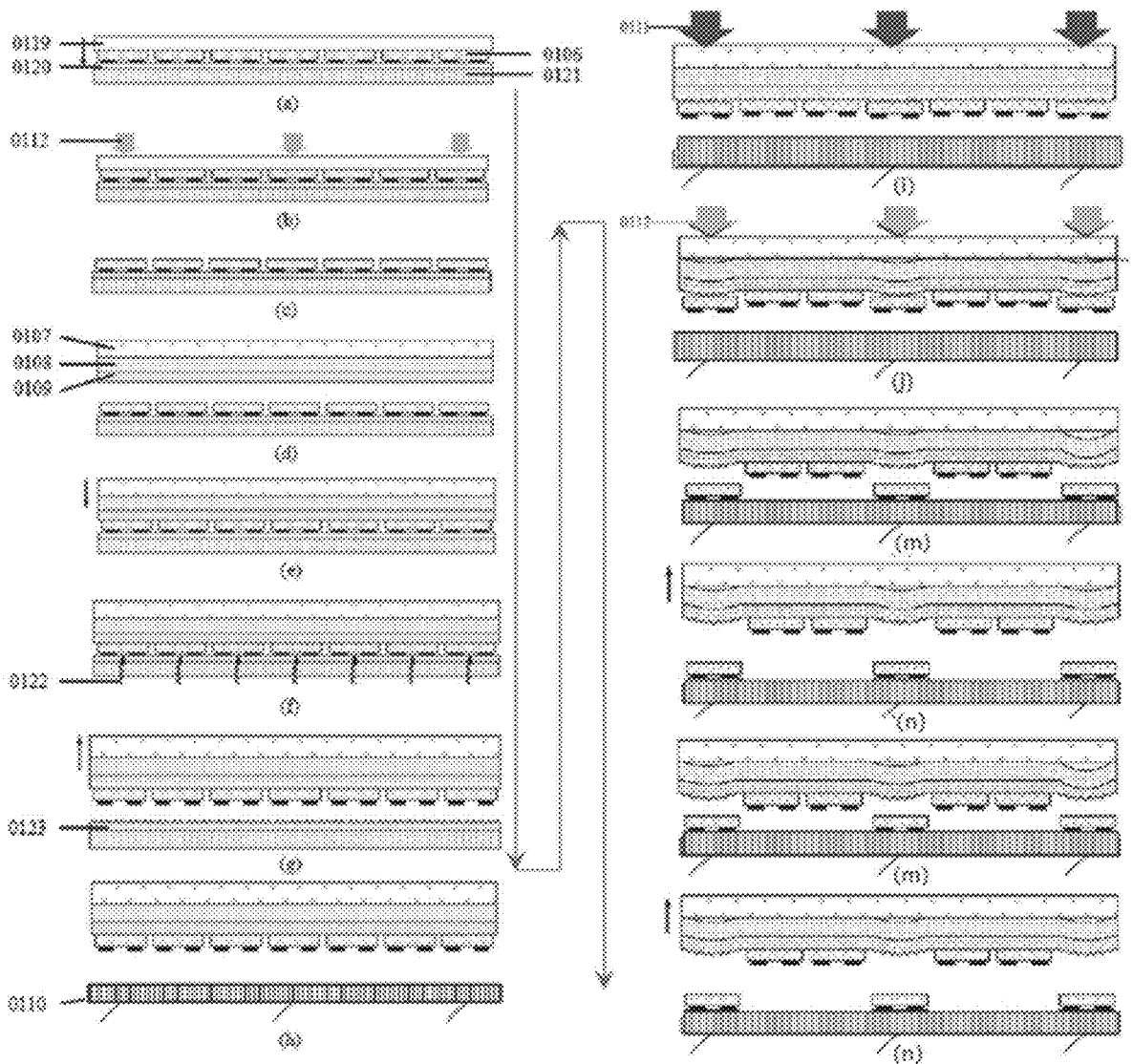
FIG. 8 is a flow chart of mass transfer under the process mode of "UV laser first and infrared laser next".

As shown in FIG. 8, FIG. 8 is a schematic diagram showing that the overall pickup and selective release of MicroLEDs are realized through the transfer device provided by the present disclosure by performing the process of selectively transferring patterned MicroLEDs from the intermediate transparent carrier substrate to the receiving substrate. Taking the process mode of "infrared laser first and UV laser next" in which the infrared laser acts first and then the UV laser acts as an example, the realization of this method normally includes the following process steps:

(1) The MicroLED array 0106 on the sapphire substrate 0119 is pressed onto the temporary receiving substrate 0121, and the MicroLED array 0106 is bonded to the thermal release adhesive layer 0120.

(2) The UV laser 0112 is adopted to pass through the sapphire substrate 0119 and irradiate the interface between the MicroLED array 0106 and the sapphire substrate 0119. Since the substrate of the MicroLED array 0106 is made of gallium nitride material, gallium nitride may absorb UV laser to thermally decompose to form liquid gallium and nitrogen gas. Therefore, the adhesion strength of the interface between the MicroLED array 0106 and the sapphire substrate 0119 is significantly reduced after being irradiated by the laser, and the MicroLED array 0106 and the sapphire substrate 0119 may be separated.

(3) The transfer of entire MicroLED array 0106 to the temporary receiving substrate 0121 is completed.

(4) The dual laser-transfer stamp 0105 provided by the present disclosure is pressed onto the temporary receiving substrate 0121 carrying the MicroLED array 0106. The dual laser-transfer stamp 0105 consists of a three-layer structure of a support layer 0107, a dynamic release layer 0108, and a adhesive foam layer 0109.

(5) Since the temporary receiving substrate 0121 serves as a temporary transition, the interface adhesion between the MicroLED array 0106 and the temporary receiving substrate 0121 (such as the heat release adhesive substrate 0702) may be reduced under certain action until it disappears, thereby realizing release of the MicroLED array 0106. This method 0123 includes heating and melting the adhesive layer to reduce the adhesion or reducing the adhesion by irradiating the adhesive layer with UV light, etc., which will not be described here. Since the interface adhesion between the temporary receiving substrate 0121 and the MicroLED array 0106 is reduced, the adhesive foam layer 0109 of the dual laser-transfer stamp may realize the overall transfer of the MicroLED array 0106.

(6) The dual laser-transfer stamp 0105 with the fabricated MicroLED array 0106 is moved onto the laser-driven platform.

(7) The MicroLED array 0106 on the dual laser-transfer stamp 0105 is set to strictly correspond to the electrode 0707 on the receiving circuit substrate 0708 one by one.

(8) The infrared laser 0111 is used to act on the adhesive foam layer 0109, and the foamed particles inside the adhesive foam layer 0109 are heated to obtain the adhesive foam layer 0109 with expanded foamed particles. Under the circumstances, the contact area between the MicroLED array 0106 and the adhesive foam layer 0109 with expanded foamed particles is significantly reduced, and the bonding between the two is in a critical state.

(9) The UV laser 0112 is used to act on the dynamic release layer 0108 from the back side of the glass substrate 0301. After the dynamic release layer 0108 is ablated by the UV laser 0112, a blister 0114 is formed, and the blister 0114 will change the curvature of the adhesive foam layer. As such, the contact area between the MicroLED array 0106 and the adhesive foam layer 0109 with the expanded foamed particles is further reduced, and the gas generated by the ablation of the dynamic release layer 0108 impacts the MicroLED array 0106 to help the MicroLED array 0106 detach from the adhesive foam layer 0109 with the expanded foamed particles.

(10) The MicroLED array 0106 is detached from the adhesive foam layer 0109 with the expanded foamed particles, and is transferred to the corresponding position on the receiving substrate 0110.

(11) After the dual laser performs action, the machine vision and other methods are adopted to observe whether there are individual untransferred chips.

(12) If there are individual untransferred chips, the infrared laser is turned on under the circumstances, and the infrared laser 0111 performs action again, so that the gas generated by the ablation by the UV laser 0112 is continuously heated, and the dynamic release layer 0108 produces larger blister 0114. In the meantime, heating the gas may further heat the foamed balls of the adhesive foam layer to continue to expand, changing the adhesion of the adhesive foam layer, thereby transferring the untransferred chips, so as to realize the successful transfer of all the MicroLED arrays 0106 to the receiving substrate 0111.

(13) The transfer process is completed, and the transfer stamp 0105 is lifted.

The foamed particles in the adhesive foam layer 0110 are selected from materials with an initially low foaming temperature and a particle size of 1 to 15 μm, which can be Aksu Microsphere Foaming Agent JH-PG07, JH-PG16, JH-PG18, etc.; the matrix of the adhesive foam layer may be high polymer polydimethylsiloxane (PDMS), viscoelasticity and other materials.

The dynamic release layer 0108 can be polyimide (PI), metal thin films (e.g., gold, aluminium), GaN thin films, triazene polymers, and the like.

The laser used in the laser peel-off technology may adopt 308 nm, 248 nm excimer laser, femtosecond 355 nm and other lasers.

The tiny gap needs to exceed the blister height created by the dynamic release layer 0108 and the adhesive foam layer 0110, and may be 8 to 50 μm.

The infrared laser may be an infrared laser with wavelengths of 808 nm and 1016 nm.

The UV laser may be a UV laser with a wavelength of 308 nm.

The forming method of the above-mentioned mass transfer device includes the following steps:

S1, selecting a hard and transparent substrate as the support layer;

S2, spin-coating the solution of the dynamic release layer on the support layer, and performing curing;

S3, selecting the materials of the adhesive foamed layer matrix and the foamed particles, mixing the two evenly to form a mixed solution, spin-coating the mixed solution on the cured dynamic release layer, and performing curing, so as to obtain the required mass transfer device.

The curing temperature cannot exceed the initial foaming temperature of the foamed particles, and the foamed particles and the adhesive foam layer solution may be uniformly mixed through magnetic stirring, ultrasonic stirring, grinding method, etc.

The main features of the present disclosure are:

1) The dual-laser mode is adopted, and the infrared laser is used to act on the adhesive foam layer in contact with the surface of the chip, so that the volume of the foamed particles inside the adhesive foam layer becomes larger after heating. As a result, the adhesion of the adhesive foam layer is reduced (the adhesion change ratio is 1000 times). The UV laser is used to act on the dynamic release layer, and the dynamic release layer is ablated to generate bubbles to change the surface curvature of the adhesive foam layer, resulting in a decrease in the adhesion between the MicroLED and the adhesive foam layer. With the assistance of dual laser, such as infrared laser acts first and UV laser acts later ("infrared laser first and UV laser next"), UV laser acts first and infrared laser acts later ("UV laser first and infrared laser next") and other process modes, the effect of changing adhesion may be achieved by regulating the contact area between the transfer stamp and the MicroLED, so as to realize the transfer of MicroLED.

2) The "proximity" method is used to control the gap between the stamp and the receiving substrate, and quickly generate a micro-spacing of blister through laser ablation, so that the original state of the chip and the receiving substrate is changed from non-contact to a weak contact to achieve high-precision and high-reliability transfer.

3) The disclosure provides a variety of process modes, such as infrared laser acts first and UV laser acts later ("infrared laser first and UV laser next"), UV laser acts first and infrared laser acts later ("UV laser first and infrared laser next") and other process modes, and the process modes may be selected flexibly according to different transfer processes. As such, the scope of application of the process is considerably broadened, and the transfer yield and transfer rate of MicroLED are ensured.

Embodiment 2

Figure 9:
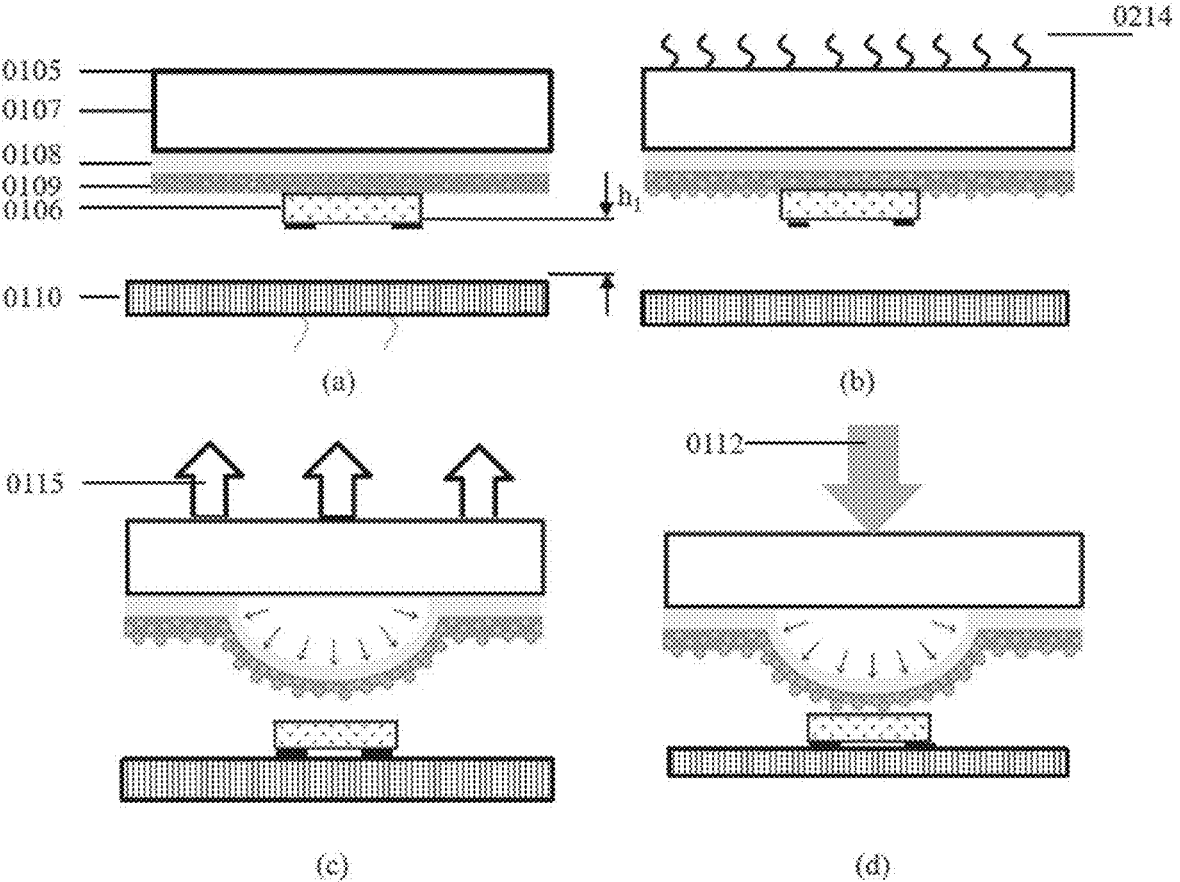
FIG. 9 is a schematic diagram of the method and operation principle of the single laser projection proximity MicroLED mass transfer provided by the present disclosure.

FIG. 9 is a schematic diagram of the principle of the single laser projection proximity MicroLED mass transfer method provided by the present disclosure. 1) As shown in (a) of FIG. 9, the stamp 0105 with the MicroLED array 0106 and the receiving substrate 0110 maintain a micron-level interval, and the stamp 0105 consists of a support layer 0902, a dynamic release layer 0108 and a adhesive foam layer 0109; 2) Under the action of heating, the foamed balls in the adhesive foam layer 0109 expand, and the interface between the stamp 0105 and the MicroLED array 0106 forms a microstructure 0112. The contact area is initially reduced, and the adhesion is initially weakened; 3) Under the irradiation of laser 0111 (see (c) of FIG. 9), the dynamic release layer 0108 in the stamp 0105 is ablated and vaporized to form blister, the contact area of the interface between the stamp 0105 and the MicroLED array 0106 is further reduced, and the adhesion is dramatically weakened. In the meantime, since the height of blister having microstructure of the stamp 0105 may be set, it is possible to realize the weak contact between the MicroLED array 0106 and the receiving substrate 0110; 4) A peeling force 0115 (see (c) of FIG. 9) is applied slowly, the stamp 0105 is lifted, and the chip is transferred to complete.

Figure 10:
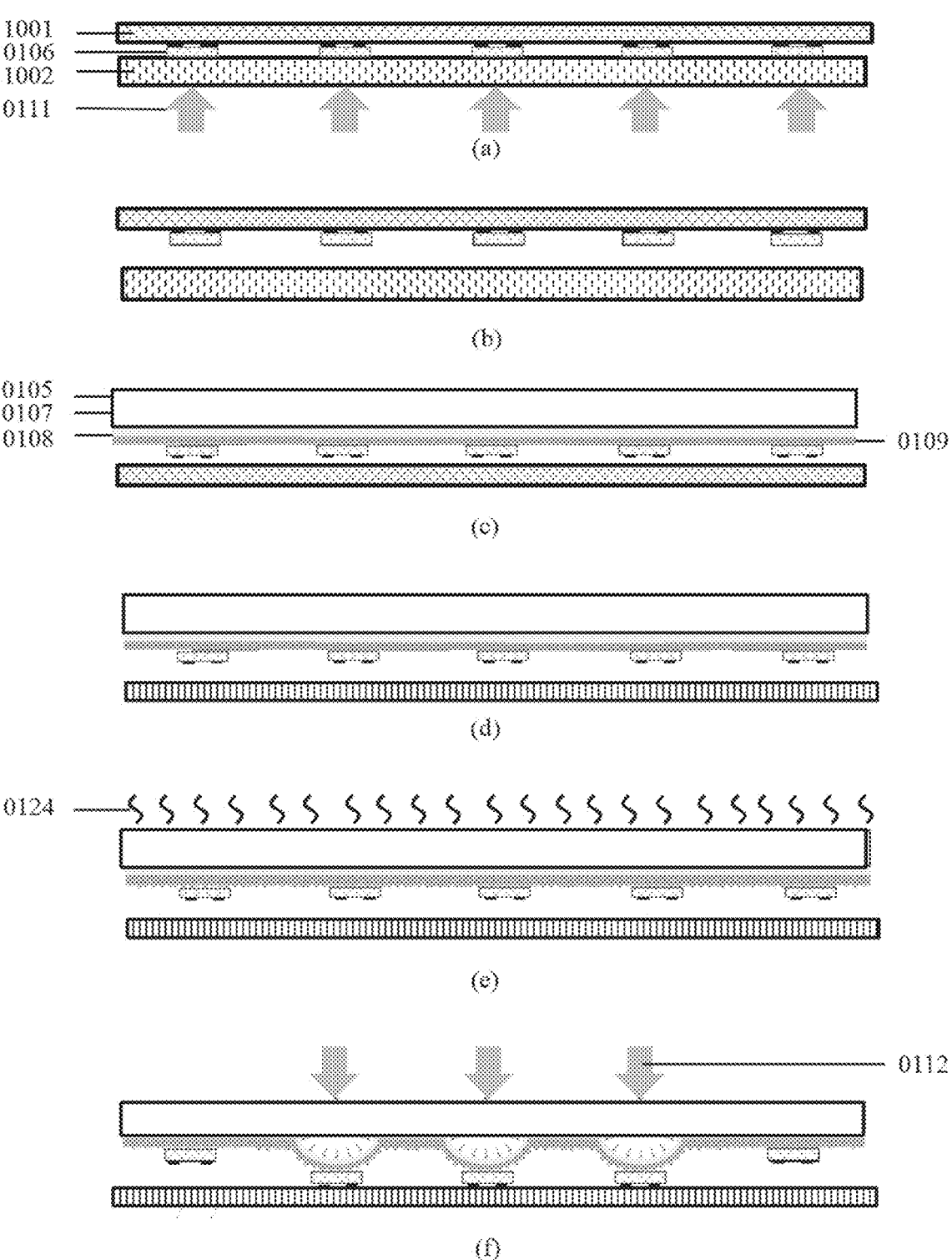
FIG. 10 is a flow chart of the mass transfer under the single laser projection proximity method according to the present disclosure.

FIG. 10 is a schematic diagram of the process of transferring the MicroLED from the sapphire substrate to the temporary receiving substrate involved in the present disclosure. The implementation of the method normally needs to involve the following steps: (1) The MicroLED array 0106 is pressed onto the temporary receiving substrate 0121. The UV laser 0112 is adopted to irradiate the MicroLED array 0106. The gallium nitride substrate of the MicroLED array 0106 may absorb the UV laser to generate thermal decomposition and form liquid gallium and nitrogen. Therefore, the MicroLED array 0106 is separated from the substrate after being irradiated by the laser. (2) The transfer of the entire MicroLED array 0106 to the temporary receiving substrate 0121 is completed. (3) The stamp 0105 provided by the present disclosure is pressed onto the temporary receiving substrate 0121 of the MicroLED array 0106, and correspondence is made. Since the temporary receiving substrate 0121 serves as a temporary transition, the interface adhesion between the MicroLED array 0106 and the temporary receiving substrate 0121 (such as a heat release adhesive substrate) may be reduced until disappearing under certain action, thereby realizing the release of the MicroLED array 0106. (4) The transfer stamp 0105 is heated, the foamed ball expands by heat, and the interface between the stamp 0105 and the MicroLED array 0106 forms a microstructure, and the initial formation changes the interface adhesion. (5) The programmable elastic transfer stamp 0105 with the fabricated MicroLED array 0106 is moved onto the laser-driven platform. (6) The laser 0101 in the transfer process is turned on, the dynamic release layer 0108 in the transfer stamp 0105 is vaporized, and blister is generated, thereby pushing the MicroLED array 0106 to contact the receiving substrate 0110. (6) A peeling force 50 is applied slowly, the stamp is lifted, so that the MicroLED array 0106 and the stamp 0105 are gradually layered (7) to complete the transfer, and the transfer stamp 0105 is lifted.

Figure 11:
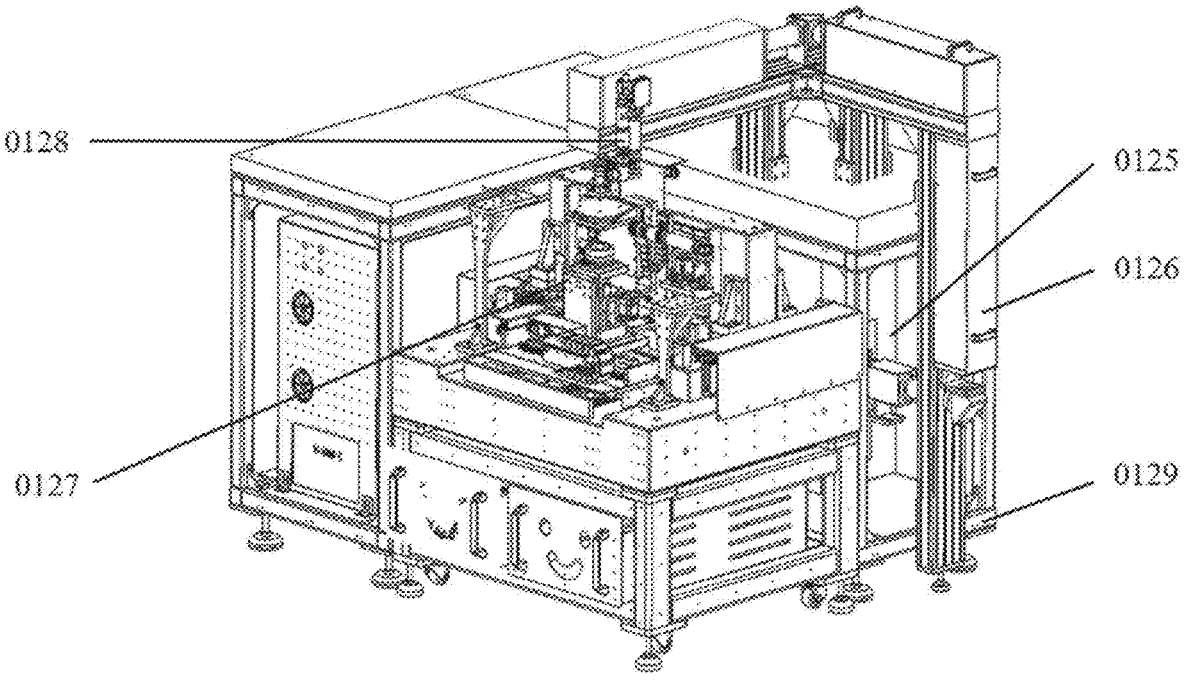
FIG. 11 is an overall layout diagram of the laser projection proximity mass transfer equipment according to the present disclosure.

FIG. 11 is a schematic diagram of the overall structure of the laser projection proximity mass transfer equipment constructed according to the present disclosure. The equipment mainly includes a laser module 0125, a laser mask projection optical path module 0126, a motion platform 0127 and a vision module 0128. The laser module 0125 is arranged on the base frame 0129 of the adjustable support, and an optical platform is also arranged on the base frame 0129, which is configured to arrange and fix the laser mask projection optical path module 0126. The motion platform 0127 (preferably a gantry-type eight-axis high-precision motion platform) and a control system thereof are fixed side by side against the subframe 0129. The vision module 0128 includes positioning observation and flight observation. The positioning observation includes a set of high-resolution and high-magnification vision modules and a set of low-resolution and low-magnification vision modules, which not only may quickly find the target chip in the low-magnification display field of view, but also may observe to partial features of the target chip in the high-magnification display field of view, so as to achieve binocular coaxial observation. The flight observation equipment integrates a time-resolved imaging system based on stroboscopic photography technology. The stroboscopic photography is similar to the photography principle of high-speed camera, that is, sharp images of moving objects are captured with very short exposure time by means of continuous flash of stroboscopic light source. The continuous flickering of the stroboscopic light source may allow realization of superimposing multiple images in the same frame of image, and is suitable for shooting the trajectory of moving objects, may be used to study the dynamic change law of the interface of the laser response layer under the action of the laser. In this manner, the transfer process of the chip may be observed in real time. In particular, when being adopted in the "proximity type" transfer process, it is possible to monitor the transfer of the chip from the non-contact state to the contact state during the actual transfer process to intuitively determine the source of the declination error.

Figure 12:
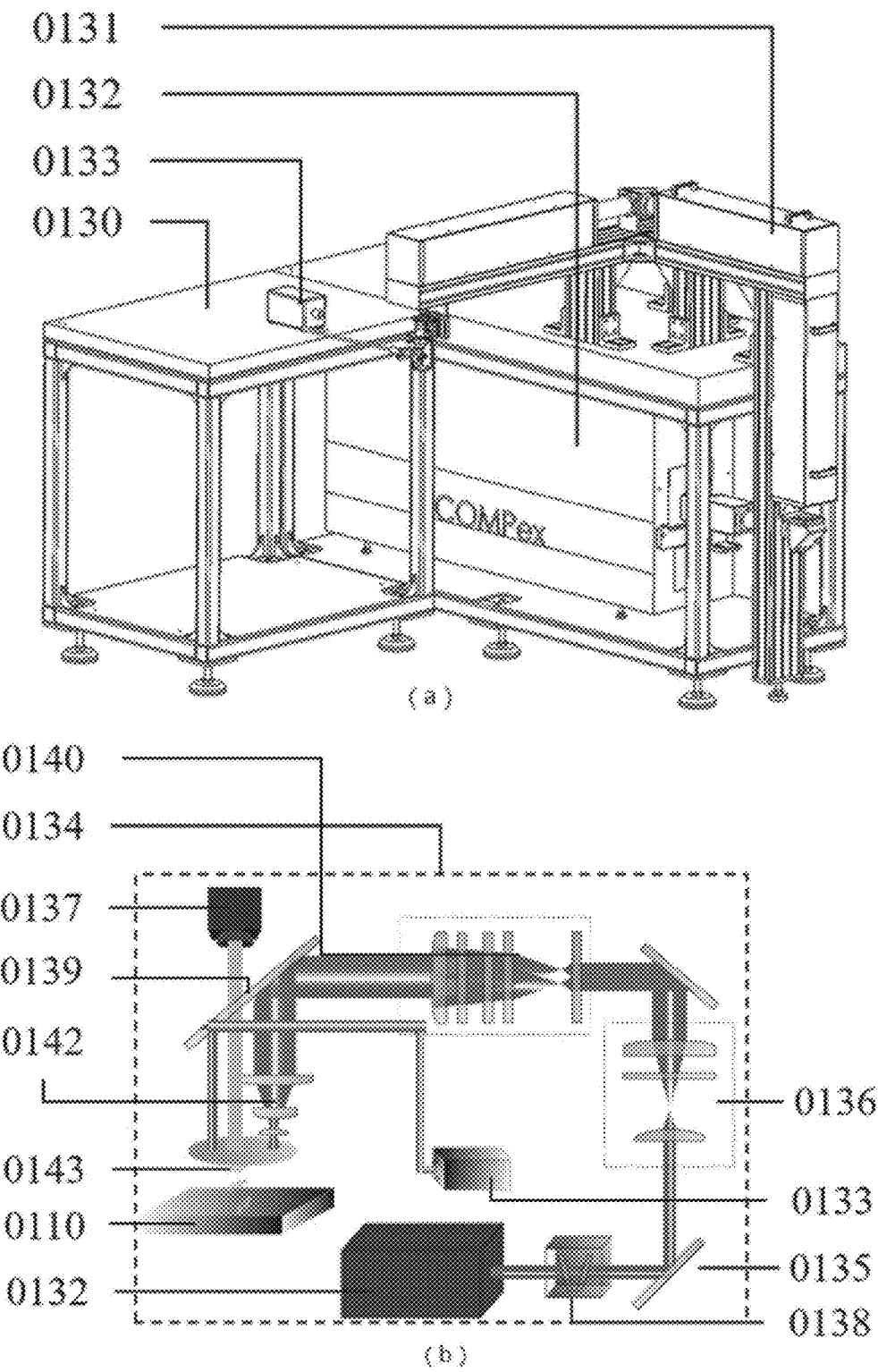
FIG. 12 is an optical path diagram of the laser mask projection according to the present disclosure.

FIG. 12 is a structural diagram and a schematic diagram of an optical path system of the laser module 0125 and the laser mask projection optical path module 0126 according to the present disclosure. In the laser projection proximity mass transfer device of the present disclosure, the laser is mainly selected from infrared laser, UV laser or a combination of the two. Referring to the schematic principle diagram of the optical path, the UV laser 0132 first adjusts the laser spot energy through the attenuator 0138, and then the laser enters the telephoto system 0136 through the mirror 0135 to expand and shape the initial light spot to a certain extent. On the one hand, the energy density on various lenses may be reduced to avoid damage to the lens; on the other hand, it is possible to take into account the optical path requirements under the geometric optics in optical path transmission. Then the homogenizer 0140 is utilized to cut the light spot in space and superimpose them on the homogenization surface, so as to homogenize the initial light spot with uneven energy. Finally, the imaging system 0141 combined with the field lens and the converging lens shrinks and focuses the homogenized light spot, and a mask component is added to the field lens of the imaging system. In the end, a custom patterned array spot with uniform energy distribution is formed at the focal plane to be applied to the laser projection proximity mass transfer process. The infrared laser 0133 adopts an optical migration transmission optical path, and is integrated with the optical path system 0134 through a transflective sheet 0139. By selecting a suitable converging lens, the focal planes 0142 of the infrared laser spot and of the UV laser spot are in the same spatial position.

Figure 13:
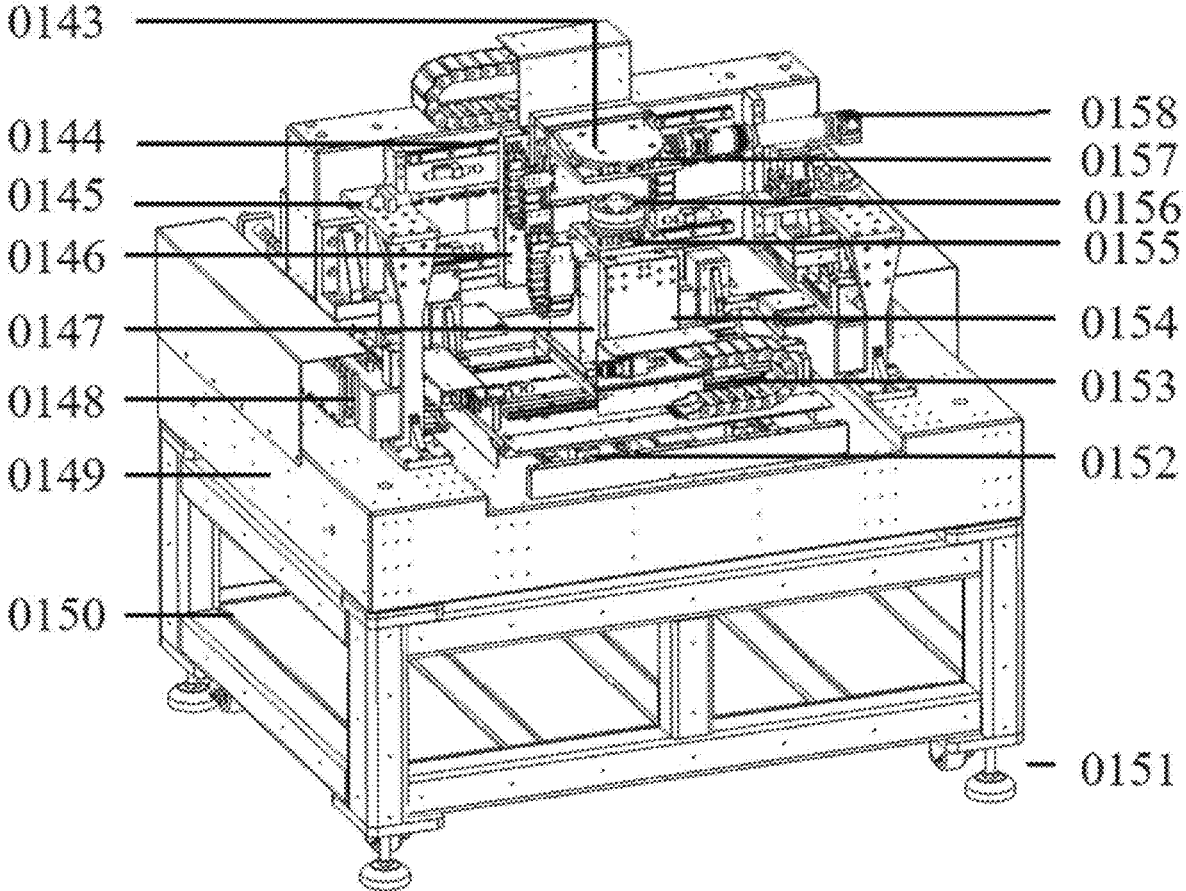
FIG. 13 is a structural diagram of a motion platform according to the present disclosure.

FIG. 13 is an overall structure diagram of the motion platform according to the present disclosure. The eight-axis high-precision motion platform contained in the equipment consists of an upper gantry wafer motion assembly 0143, a lower gantry wafer motion assembly 0147, a marble base 0149, a motion platform bracket 0150, a vacuum adsorption assembly 0157, a support base 0151, etc. Specifically, the two horizontal axes of X1 axis 0153 and Y1 axis 0152 contained in the lower gantry wafer motion assembly 0147 perform the initial alignment work before the patterning transfer (to align the laser spot with the circuit substrate electrodes placed on the receiving substrate), and ensure the subsequent continuous processing precision by means of feedback position information in real time through a grating scale. The included Z1 axis 0154 is responsible for adjusting the substrate distance between the receiving substrate and the chips on the donor wafer, and the included θ1 turntable 0155 is responsible for adjusting the angle of the circuit substrate electrodes placed on the receiving substrate. The two horizontal axes of X2 axis 0144 and Y2 axis 0148 included in the upper gantry wafer motion assembly are responsible for performing the initial alignment operation before patterning transfer (to align the laser spot with the chip placed on the wafer disk). The included Z2 axis 0146 is responsible for adjusting the distance between the processing surface on the wafer disk and the laser focal plane, and the included θ2 turntable 0157 is responsible for adjusting the angle of the rectangular chip placed on the wafer. The flight observation stroboscopic light source 0145 and the flight observation camera 0158 are erected on both sides of the transfer substrate to form a flight observation module.

Through the above design, the method and equipment may realize the patterned laser peel-off GaN process, and complete the transfer of MicroLED from the original substrate to the temporary substrate by scanning or overall irradiation. When being applied to the mass transfer process, through the self-leveling multi-axis servo module carrying the stamp and receiving substrate for relative movement or integral movement, the laser mask projection optical path module forms a projection pattern light spot scaled according to a certain proportion on the focal plane to realize the laser transfer of the MicroLED chip. The disclosure may be used for the MicroLED dead pixel removal process. After the mask is replaced with a single-hole mask, an approximate point light spot may be obtained, and the defective chips on the temporary substrate can be removed.

Those skilled in the art can easily understand that the above descriptions are only preferred embodiments of the present disclosure, and are not intended to limit the present disclosure. Any modifications, equivalent replacements and improvements made within the spirit and principles of the present disclosure, etc., should all be included within the protection scope of the present disclosure.

What is claimed is:

1. A preparation method of a mass transfer module for a laser projection proximity mass transfer device, wherein the laser projection proximity mass transfer device comprises:

a laser module, a laser mask projection optical path module, a vision module, and a mass transfer module, wherein the mass transfer module comprises a support layer, a dynamic release layer and an adhesive foam layer arranged in a top-down setup;

wherein the support layer is a base layer; the dynamic release layer is arranged on the support layer, under an action of a laser, the dynamic release layer is ablated to generate an ablation gas, thereby causing the dynamic release layer to generate a blister, wherein the adhesive foam layer is arranged on the dynamic release layer, and the adhesive foam layer is in contact with a MicroLED to be transferred, under an action of thermal stimulation or the laser, foamed particles inside the adhesive foam layer expand, reducing a adhesion of the adhesive foam layer, so as to peel off the MicroLED to be transferred;

wherein the laser module is configured to emit the laser, the laser mask projection optical path module is configured to project the laser to the dynamic release layer, and the vision module is configured to observe a transfer process of the MicroLED to be transferred in real time, wherein the preparation method comprises the following steps:

S1, selecting a hard and transparent substrate as the support layer;

S2, spin-coating a solution of the dynamic release layer on the support layer, and performing curing;

S3, selecting a material of a matrix of the adhesive foam layer and the material of the foamed particles, mixing the two evenly to form a mixed solution, spin-coating the mixed solution on the cured dynamic release layer, and performing curing, so as to obtain the required mass transfer device.

2. The preparation method according to claim 1, wherein in step S2, a curing temperature is 180° C. to 220° C., and a curing time is 3 hours to 5 hours.

3. The preparation method according to claim 1, wherein in step S3, a curing temperature is 60° C. to 90° C., and a curing time is 10 minutes to 20 minutes.

* * * * *